United States Patent
Tsuruta

(10) Patent No.: US 6,636,413 B2
(45) Date of Patent: Oct. 21, 2003

(54) ELECTROSTATIC CHUCKS AND PROCESS FOR PRODUCING THE SAME

(75) Inventor: Hideyoshi Tsuruta, Tokai (JP)

(73) Assignee: NGK Insulators, Inc., Nagoya (JP)

( * ) Notice: Subject to any disclaimer, the term of this patent is extended or adjusted under 35 U.S.C. 154(b) by 0 days.

(21) Appl. No.: 10/004,736

(22) Filed: Dec. 4, 2001

(65) Prior Publication Data

US 2002/0109954 A1 Aug. 15, 2002

(30) Foreign Application Priority Data

Dec. 11, 2000 (JP) .................................... 2000-376158

(51) Int. Cl.[7] ............................................. H01T 23/00
(52) U.S. Cl. ..................................................... 361/234
(58) Field of Search ............................... 361/234, 230, 361/231, 233–235; 279/128; 269/8; 219/385; 118/500

(56) References Cited

U.S. PATENT DOCUMENTS 6,535,371 B1 * 3/2003 Kayamoto et al. .......... 361/234

FOREIGN PATENT DOCUMENTS

JP        07245336    *  9/1995
JP        08055900    *  2/1996

* cited by examiner

Primary Examiner—Edward H. Tso
Assistant Examiner—Pia Tibbits
(74) Attorney, Agent, or Firm—Burr & Brown

(57) ABSTRACT

An electrostatic chuck including a dielectric layer made of aluminum nitride, an inner electrode buried in the dielectric layer, and a surface layer covering a surface of the dielectric layer. The surface layer is made of a material harder than the aluminum nitride constituting the dielectric layer and having a thickness of not less than 200 nm, and the surface of the dielectric layer has a center-line average surface roughness of not more than 25 nm. The electrostatic chuck is adapted to adsorb a wafer onto the dielectric layer through the surface layer.

16 Claims, 1 Drawing Sheet

ELECTROSTATIC CHUCKS AND PROCESS FOR PRODUCING THE SAME

BACKGROUND OF THE INVENTION

The present invention relates to electrostatic chucks and a process for producing the same.

Heretofore, electrostatic chucks have been used to adsorb and hold semiconductor wafers in various steps represented by transferring, light exposing, film-forming such as CVD, washing, and fine processing such as etching and dicing for such semiconductor wafers. A number of projections or embossed portions are usually provided projecting from a setting face of an insulating layer of the electrostatic chuck, so that a semiconductor wafer is contacted with top surfaces (contact surfaces) of the projections. Further, DC voltage is applied to an internal electrode inside the insulating layer so that Johnson-Rahbeck force may be generated at a contact interface between contacting surfaces of the semi-conductor wafer and the projections, thereby adsorbing the semiconductor wafer on the contacting surface. Therefore, the adsorbing force for the semiconductor wafer can be increased by enlarging the area of the contacting surfaces (top surfaces) of the projections.

However, the electrostatic chuck has a problem in that particles are formed at a side of a back side surface (a surface to be adsorbed) of the wafer. The particles are principally particles which are formed when silicon is ground after they are attached to a silicon wafer, particles of aluminum nitride which come off from the surface of the electrostatic chuck, particles of organic material which remain on the surface of the electrostatic chuck, etc.

The particles are generated only when the wafer is adsorbed onto the electrostatic chuck. However, particularly when a low-temperature wafer is adsorbed onto the electrostatic chuck held at a high temperature or when heat is inputted from plasma to the wafer in the state that the low-temperature wafer is adsorbed onto the electrostatic chuck at a low temperature, the wafer is heated and thermally expands while an adsorbing force is being generated for the wafer. Consequently, the back side surface of the wafer rubs the surface of the electrostatic chuck. In such a case, particles are likely to be formed.

JP-A 7-245336 discloses that when a silicon wafer contacts uneven portions at the adsorbing surface of the ceramic electrostatic chuck, the silicon wafer having a relatively low hardness is ground by these uneven portions to generate particles and that such uneven portions are ground by irradiating plasma upon the adsorbing surface of the electrostatic chuck, thereby rounding fine projections and reducing the formation of the particles.

JP-A 8-55900 discloses a method in which when a silicon wafer is to be adsorbed onto an electrostatic chuck, voltage to be applied to the electrostatic chuck is gradually increased to mitigate impact occurring when the silicon wafer contacts the electrostatic chuck and reduce the generation of particles resulting from uneven portions at an adsorbing surface of the electrostatic chuck.

In order to reduce the generation of the particles, the contact area between the back side surface of the wafer and the corresponding surface of the electrostatic chuck has been reduced. However, this method has a problem. That is, since a backside gas is ordinarily flown between the wafer and the electrostatic chuck, the wafer is floated with the pressure of the backside gas, if an adsorbing force is weak for the wafer. Therefore, the adsorbing force for the wafer must be sufficiently higher than the pressure of the backside gas.

The total adsorbing force is a product between the contacting area and an adsorbing force per unit area at the contacting portion. Therefore, if the contacting area between the back side surface of the wafer and the surface of the electrostatic chuck is reduced, the adsorbing force per unit area needs to be increased accordingly. For this purpose, the voltage to be applied needs to be increased, for example. However, if the adsorbing force per unit area is increased, shearing stress applied to the wafer increases when the wafer is thermally expanded after being adsorbed. As a result, particles are generated on the wafer.

If aluminum nitride particles are peeled from the wafer, such peeled particles become particles in concern, which not only interrupt wiring of the chip circuit and reduce the production yield of chips, but also cause changes in the wafer-adsorbing characteristics of the electrostatic chuck and make the wafer-treating process unstable.

SUMMARY OF THE INVENTION

It is an object of the present invention to provide an electro-static chuck provided with an dielectric layer made of aluminum nitride upon which a wafer is to be adsorbed, the electrostatic chuck being able to prevent the generation of particles resulting from thermal expansion of the wafer after being adsorbed onto the electrostatic chuck.

The invention also provides a method for producing such an electrostatic chuck.

The electrostatic chuck according to the present invention comprises a dielectric layer made of aluminum nitride, and a surface layer covering a surface of the dielectric layer, made of a material harder than the aluminum nitride constituting the dielectric layer and having a thickness of not less than 200 nm, said surface of the dielectric layer having a center-line average surface roughness of not more than 25 nm, and said electrostatic chuck being adapted to adsorb a wafer onto the dielectric layer through the surface layer.

The electrostatic chuck producing method according to the present invention comprises the steps of preparing the dielectric layer made of the aluminum nitride, adjusting a surface of the dielectric layer to a center-line average surface roughness of not less than 25 nm, and covering the surface of the dielectric layer with not less than 200 nm in thickness of a material harder than said aluminum nitride constituting the dielectric layer.

BRIEF DESCRIPTION OF THE DRAWINGS

For a better understanding of the invention, reference is made to the attached drawings, wherein.

DETAILED DESCRIPTION OF THE INVENTION

The present inventor discovered that generation of particles as mentioned above can be conspicuously reduced by highly smoothing the surface of the dielectric layer to a center-line average surface roughness of not more than 25 nm and then forming a film of another hard material on the dielectric layer. The inventor has reached the present invention based on this discovery.

Figure 1:
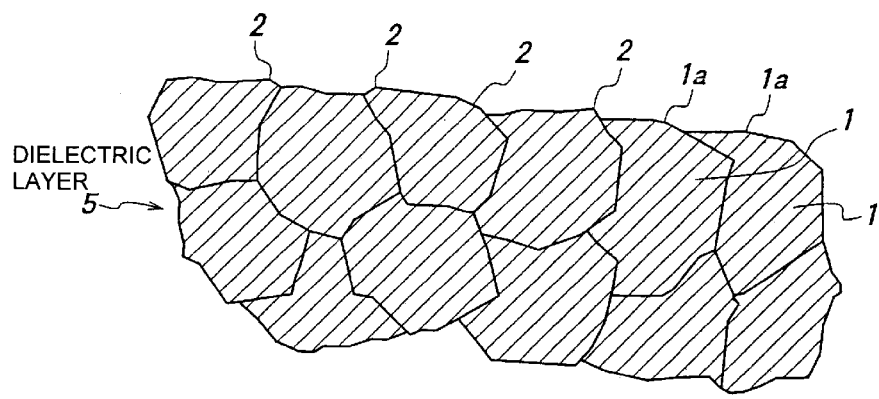
FIG. 1 is a sectional view of schematically illustrating a state of an electrostatic chuck in which a dielectric layer 5 is polished.

In the following, the present invention will be explained with reference to FIGS. 1 and 2.

The electrostatic chuck according to the present invention generally comprises a dielectric layer, an electrically chucking electrode buried in the dielectric layer, and a hard surface layer covering the surface of the dielectric layer.

Figure 2:
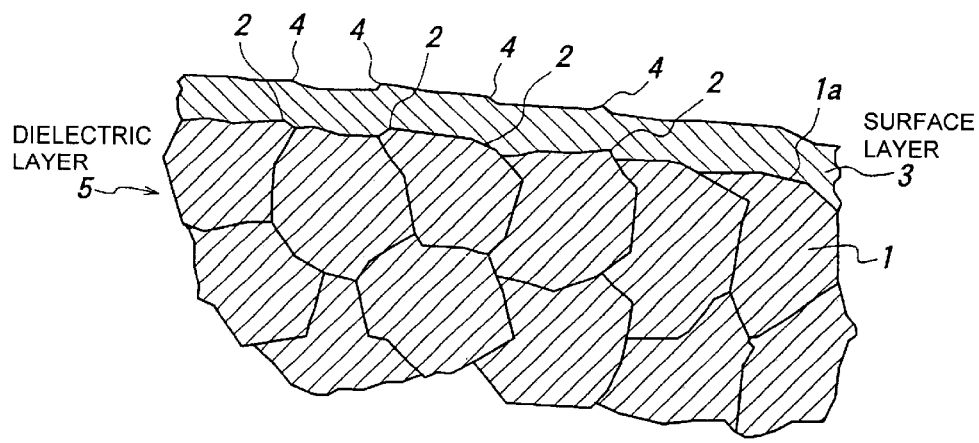
FIG. 2 is a sectional view of schematically illustrating the state of an electrostatic chuck in which a dielectric layer 5 is polished and a surface layer 3 is formed on the dielectric layer 5.

As schematically shown in FIG. 2, the present inventor first tried to form a surface-strengthening film 3 of alumina is formed on a surface of a dielectric layer 5 of aluminum nitride to reinforce the surface and prevent the generation of particles. However, it was found that particles still occurred under the condition that while the wafer was adsorbed onto the chuck, the wafer was heated. Increase in such particles resulted principally from partial feeling of the modifying film 3.

The inventor has strenuously made investigations to prevent particles resulting from the peeling of the surface-strengthening film 3. The inventor found during this course of the investigations that the surface state of the dielectric layer 5 immediately before the formation of the surface-strengthening film is important. That is, if a film 3 of a hard material is formed after the surface of the dielectric layer 1 is finely polished to the center-line average surface roughness of not more than 25 nm, occurrence of the particles due to the peeling of the film as mentioned above can be prevented.

The reason why such functions and effects are obtained is unclear, but it may be considered as follows. That is, as schematically shown in FIG. 1, a surface of an aluminum nitride layer slightly vertically differs in height depending upon respective crystalline particles 1. In other words, minute steps 2 exist in regions among the particles. Therefore, as shown in FIG. 2, if the dielectric layer 5 is covered with a layer 3 of alumina, for example, minute steps 4 are formed at the surface of the alumina layer, following the surface state of the underlying aluminum nitride layer 5. That is, the film is formed, acutely tracing the steps 2, on surface of the dielectric layer 5. The film is weak, around such acute steps 4, against shearing forces in lateral directions as viewed in FIG. 2. Owing to this, it is considered that when the wafer thermally expands after it is adsorbed onto the electrostatic chuck, the film is likely to be peeled.

The average particle diameter of the aluminum nitride particles 1 is usually not less than 1 $\mu$m (1000 nm), and more often not less than 2 $\mu$m (2000 nm). On the other hand, the center-line average surface roughness of the surface of the dielectric layer 5 was conventionally around 30 to 50 nm. Therefore, even if steps exist at the surfaces 1a of the particles 1, the sizes of the steps are sufficiently smaller than the particle diameters of the particles. Therefore, it is considered that influences giving rise to occurrence of the particles must be ordinarily substantially non-existent. Further, when occurrence test of particles was effected in the state that no layer 3 was formed on the dielectric layer 5, the amount of the particles formed did not change whichever the center-line average surface roughness of the dielectric layer 5 was 50 nm or not more than 25 nm. Therefore, if the dielectric layer has a smooth surface at around not more than 50 nm, the surface must give no influence upon the occurrence of the particles. Further, the thickness of the surface layer 3 formed on the dielectric layer needs to be not less than 200 nm, which must be therefore sufficiently larger than the steps of the underlying layer.

To the contrary, however, it was discovered that if the center-line average surface roughness of the surface of the underlying dielectric layer even slightly varies, it gives conspicuous influence upon the easiness of the peeling of the surface layer 3 and the amount of the particles formed.

In a preferred embodiment, the thickness of the surface layer 3 is not less than 500 nm. If the thickness of the surface layer 3 exceeds 5 $\mu$m and when heat cycles are applied to the surface layer 3, the film is likely to be peeled with the heat cycles. From this point of view, the thickness of the film is more preferably not more than 3 $\mu$m.

The material harder than aluminum nitride is a material having a Vickers hardness of not less than 1300 Hv.

As the material which is harder than aluminum nitride, a material selected from the group consisting of alumina-based ceramics (preferably produced by CVD), alumina-containing composite materials, diamond-like carbon (DLC) and diamond, etc. are preferred. From the standpoint of the corrosion resistance of the surface layer against a halogen-based corrosive gas such as fluorine gas, the alumina-based ceramics and the alumina-containing composite materials are preferred.

In the alumina-containing composite material, as a material combined with alumina, metal oxides such as calcia, magnesia and yttria are preferred.

The average particle diameter of aluminum nitride particles constituting the aluminum nitride layer is preferably not less than 1 $\mu$m, and preferably not more than 10 $\mu$m.

An electrode for the electrostatic chuck is not limited to any material. The material may be an electrically conductive ceramic material or a metal, and a high melting point metal is particularly preferred, and molybdenum, tungsten, molybdenum and an alloy between molybdenum and tungsten are more particularly preferred.

As a backside gas to be flown between a back side surface of the wafer and the corresponding surface of the electrostatic chuck, a known gas such as helium, argon or a mixed gas of helium and argon may be used, for example.

In the present invention, after at least the dielectric layer is molded and fired, the surface of the dielectric layer is finely polished to a center-line average surface roughness of 25 nm or less. The method for producing the aluminum nitride is not limited to any particular one, but a sintered aluminum nitride layer is preferred. The fine polishing is not limited to any particular one, but a sintering method is preferred. but polishing is preferably effected by using a slurry containing an oxidizing agent.

Thereafter, the surface of the dielectric layer 5 is coated with a surface layer, at a thickness of not less than 200 nm, made of a material harder than aluminum nitride constituting the dielectric layer 5. The formation of the surface layer is not limited to any particular method, but a sputtering method, a chemical vapor deposition method or a physical vapor deposition method may be used.

It is preferable that an inert gas is used for sputter etching the surface 1a of the dielectric layer 5 before the formation of the surface layer 3. As this inert gas, argon is particularly preferred. The above sputter etch can clarify the surface of the dielectric layer and enhance the adhesion between the surface layer 3 and the dielectric layer 5.

At that time, if oxygen is incorporated into the inert gas atmosphere used for the sputter etch, the surface of the dielectric layer is slightly oxidized on sputter etching to further enhance the adhesion between the dielectric layer and the surface layer such as the alumina film, for example.

It is preferable that the molar ratio of oxygen in the inert gas atmosphere is 1 to 20 mol %.

(Examples)
(Experiment 1)

A powder of aluminum nitride was molded into a discoid molded body. Then, an internal electrode of molybdenum is placed on this molded body, and an aluminum nitride powder is further filled on the molded body with the electrode, which is molded again, thereby obtaining a discoid molded body in which the internal electrode is buried. Then, this molded body was sintered in a nitrogen atmosphere, thereby producing a discoid electrostatic chuck having a diameter of 75 mm and a thickness of 1 mm and burying the internal electrode therein.

Next, the surface of the dielectric layer 3 was polished. The particle diameters of alumina particles constituting a slurry, a kind of an oxidizing agent and a pH value of the slurry were so varied on polishing that the center-line average surface roughness might be a value in Table 1.

An electrically conductive paste was coated on a back side surface of each sample. The conductive paste-attached sample (room temperature) was placed on a silicon wafer of 75 mm in diameter heated at 400° C., and DC voltage of ±500 V was applied between the wafer and the conductive paste, thereby adsorbing the silicon wafer to the electrostatic chuck. Then, a 50 mm² area of the adsorbed wafer was observed with a scanning type electrostatic microscope, and the number of peeled particles was counted. These results are shown in Table 1.

TABLE 1

| Center-line average surface roughness Ra (nm) | Number of peeled particles (particles/mm²) on wafer |
| --- | --- |
| 320 | 1.5 |
| 51 | 0.8 |
| 35 | 0.9 |
| 25 | 1.1 |
| 18 | 0.7 |

As is seen from Table 1, no conspicuous change in the number of the peeled particles exists in a rang of 320–18 nm for the center-line average surface roughness. Even when the center-line average surface roughness of the surface of the dielectric layer was reduced to 25 nm or less, for example, no significant reduction in the number of the peeled particles was seen.

(Experiment 2)

A dielectric layer in each sample was worked to a center-line average surface roughness shown in Table 2 in the same manner as in Experiment 1. Then, a film of high purity alumina was formed on each electrostatic chuck sample according to the sputtering method. At that time, the sample was placed in argon atmosphere, and the surface of the dielectric layer was clarified by sputter etching. Into the argon atmosphere was incorporated 10 mol % of oxygen. Next, a film 3 in a thickness of 2 μm was formed by sputtering high-purity alumina under the following condition. The number of peeled particles on the wafer was measured for each sample in the same way as in Experiment 1.

Pressure: 1 Pa
Output: 400 W
Substrate temperature 300° C.

TABLE 2

| Center-line average surface roughness Ra (nm) | Number of peeled particles (particles/mm²) on wafer |
| --- | --- |
| 320 | 1.1 |
| 52 | 0.9 |
| 34 | 0.5 |
| 25 | 0.0 |
| 17 | 0.0 |

As is seen from Table 2, the number of peeled particles on the wafer was successfully reduced to 0/mm² by adjusting the center-line average surface roughness of the underlying layer of the alumina film to not more than 25 nm. In particular, when the center-line average surface roughness was 350 nm, 52 nm or 34 nm, almost no change occurs in the number of the peeled particles on the wafer as compared with Experiment 1 with no alumina film, even if an alumina film was formed on the substrate. However, when the center-line average surface roughness was 25 nm or less and an alumina layer was provided, the number of the peeled particles on the wafer conspicuously decreased to 0.0/mm².

(Experiment 3)

An experiment was effected in the same manner as in Experiment 2, provided that the center-line average surface roughness after working an underlying dielectric layer was adjusted to 20 nm. Further, the thickness of the alumina layer 3 was varied between 0.5 μm and 10 μm.

TABLE 3

| Thickness of surface layer 3 (μm) | Number of peeled particles (particles/mm²) on wafer |
| --- | --- |
| 0.5 | 0.0 |
| 1.0 | 0.0 |
| 2.0 | 0.0 |
| 5.0 | 0.0 |
| 10.0 | 0.2 |

As is seen from Table 3, when the thickness of the surface layer was set to even 10 μm, the number of the peeled particles was reduced to 0.2/mm², whereas in order to reduce the number of the peeled particles to 0.0/mm², the thickness of the surface layer is preferably 5.0 μm or less.

As mentioned above, the present invention is directed to the electrostatic chuck comprising the dielectric layer made of aluminum nitride and adapted to adsorb the wafer onto the dielectric layer, and the electrostatic chuck can prevent occurrence of the particles resulting from the thermal expansion of the wafer after the wafer is adsorbed onto the electrostatic chuck.

What is claimed is:

1. An electrostatic chuck comprising a dielectric layer made of aluminum nitride, an inner electrode buried in the dielectric layer, and a surface layer covering a surface of the dielectric layer, said surface layer being made of a material harder than the aluminum nitride constituting the dielectric layer and having a thickness of not less than 200 nm, said surface of the dielectric layer having a center-line average surface roughness of not more than 25 nm, and said electrostatic chuck being adapted to adsorb a wafer onto the dielectric layer through the surface layer.

2. The electrostatic chuck set forth in claim 1, wherein the material harder than said aluminum nitride is selected from a group consisting of an alumina-based ceramic material, an alumina-containing composite material, diamond-like carbon and diamond.

3. The electrostatic chuck set forth in claim 1, wherein the average particle diameter of aluminum nitride particles constituting the aluminum nitride is 1 to 10 μm.

4. The electrostatic chuck set forth in claim 2, wherein the average particle diameter of aluminum nitride particles constituting the aluminum nitride is 1 to 10 μm.

5. A method for producing an electrostatic chuck adapted to adsorb a wafer onto a dielectric layer made of aluminum nitride, comprising the steps of preparing the dielectric layer made of the aluminum nitride, adjusting a surface of the dielectric layer to a center-line average surface roughness of not less than 25 nm, and covering the surface of the dielectric layer with not less than 200 nm in thickness of a material harder than said aluminum nitride constituting the dielectric layer.

6. The electrostatic chuck-producing method set forth in claim 5, wherein said aluminum nitride is selected from a group consisting of an alumina-based ceramic material, an alumina-containing composite material, diamond-like carbon and diamond.

7. The electrostatic chuck-producing method set forth in claim 5, wherein aluminum nitride particles constituting said aluminum nitride has an average particle diameter of 1 to 10 μm.

8. The electrostatic chuck-producing method set forth in claim 6, wherein aluminum nitride particles constituting said aluminum nitride has an average particle diameter of 1 to 10 μm.

9. The electrostatic chuck-producing method set forth in claim 5, wherein the surface of the dielectric layer is inversely sputtered with an inert gas before the surface layer is formed.

10. The electrostatic chuck-producing method set forth in claim 6, wherein the surface of the dielectric layer is inversely sputtered with an inert gas before the surface layer is formed.

11. The electrostatic chuck-producing method set forth in claim 7, wherein the surface of the dielectric layer is inversely sputtered with an inert gas before the surface layer is formed.

12. The electrostatic chuck-producing method set forth in claim 8, wherein the surface of the dielectric layer is inversely sputtered with an inert gas before the surface layer is formed.

13. The electrostatic chuck-producing method set forth in claim 9, wherein said inverse sputtering is effected with the inert gas containing oxygen.

14. The electrostatic chuck-producing method set forth in claim 10, wherein said inverse sputtering is effected with the inert gas containing oxygen.

15. The electrostatic chuck-producing method set forth in claim 11, wherein said inverse sputtering is effected with the inert gas containing oxygen.

16. The electrostatic chuck-producing method set forth in claim 12, wherein said inverse sputtering is effected with the inert gas containing oxygen.

* * * * *

UNITED STATES PATENT AND TRADEMARK OFFICE
CERTIFICATE OF CORRECTION

PATENT NO. : 6,636,413 B2
DATED : October 21, 2003
INVENTOR(S) : Hideyoshi Tsuruta It is certified that error appears in the above-identified patent and that said Letters Patent is hereby corrected as shown below:

<u>Title page,</u>
Item [73], please change "NGK Insulators, Inc." to -- NGK Insulators, Ltd. --

Signed and Sealed this

Twentieth Day of January, 2004

JON W. DUDAS
*Acting Director of the United States Patent and Trademark Office*